United States Patent [19]
Allen

[11] Patent Number: 5,654,245
[45] Date of Patent: Aug. 5, 1997

[54] IMPLANTATION OF NUCLEATING SPECIES FOR SELECTIVE METALLIZATION AND PRODUCTS THEREOF

[75] Inventor: Gregory Lee Allen, Vancouver, Wash.

[73] Assignees: Sharp Microelectronics Technology, Inc., Camas, Wash.; Sharp Kabushiki Kaisha, Osaka, Japan

[21] Appl. No.: 36,049

[22] Filed: Mar. 23, 1993

[51] Int. Cl.$^6$ .................... H01L 21/285; H01L 21/465
[52] U.S. Cl. .................... 438/629; 427/304; 427/305; 427/437; 438/675; 438/677; 438/641
[58] Field of Search .................... 437/245, 195, 437/192, 304, 305, 437

[56] References Cited

U.S. PATENT DOCUMENTS

| | | | |
|---|---|---|---|
| 4,746,621 | 5/1988 | Thomas et al. | |
| 4,907,066 | 3/1990 | Thomas et al. | |
| 5,154,949 | 10/1992 | Shindo et al. | |
| 5,180,687 | 1/1993 | Mikoshiba et al. | 437/187 |
| 5,183,795 | 2/1993 | Ting et al. | 437/230 |
| 5,459,100 | 10/1995 | Choi | 437/195 |

FOREIGN PATENT DOCUMENTS 02162722  6/1990  Japan .

OTHER PUBLICATIONS

D.C. Thomas et al., "A Multilevel Tungsten Interconnect Technology", Tech Digest, IEDM 1988, pp. 466–469.

J.S.H. Cho et al., "Copper Interconnection with Tungsten Cladding for ULSI", 1991 Symposium on VLSI Technology, Oiso, Japan, pp. 37–40.

B. Rogers et al., "Issues in a Submicron Cu Interconnect System Using Liftoff Patterning", IEEE VMIC Conference Proceedings, Jun. 1991, pp. 137–143.

D.S. Gardner et al., "Encapsulated Copper Interconnection Devices Using Sidewall Barriers", VMIC Conference Proceedings, Jun. 1991, pp. 99–108.

J.A.T. Normal et al., "New OMCVD Precursors For Selective Copper Metallization", VMIC Conference Proceedings, Jun. 1991, pp. 123–129.

J.D. McBrayer et al., "Diffusion of Metals in Silicon Dioxide", J. Electrochem. Soc., vol. 133, Jun. 1986, pp. 1242–1246.

S. Wolf et al., "Silicon Processing for the VLSI Era", Process Technology, vol. 1 & 2 Lattice Press (1986), pp. 261, 403.

Primary Examiner—George Fourson
Assistant Examiner—C. Everhart
Attorney, Agent, or Firm—Fliesler, Dubb, Meyer & Lovejoy

[57] ABSTRACT

The invention provides a method and structure in which a nucleating species [54] is implanted through apertures [52] of a metal-phobic layer [40] into a support layer [17] and copper or a like metal is selectively grown at the implant site or sites. The implant support layer [17] is preferably composed of a material which inhibits diffusion therethrough of the copper or other like grown metal.

29 Claims, 4 Drawing Sheets

IMPLANTATION OF NUCLEATING SPECIES FOR SELECTIVE METALLIZATION AND PRODUCTS THEREOF

BACKGROUND

1. Field of the Invention

The invention relates generally to the fabrication of integrated circuits. The invention is directed more specifically to the formation of patterned metallization layers in electronic integrated circuits.

2a. Cross Reference to Publications in the Related Art

The following publications are believed relevant to the below discussion and are incorporated herein by reference.

(1) D. C. Thomas et al, "A Multilevel Tungsten Interconnect Technology," Tech Digest, IEDM 1988, pp 466–469.

(2) J. S. H. Cho et al, "Copper Interconnection with Tungsten Cladding for ULSI," 1991 Symposium on VLSI Technology, Oiso, Japan, pages 32–40.

(3) B. Rogers et al, "Issues in a Submicron Cu Interconnect System Using Liftoff Patterning," IEEE VMIC Conference Proceedings, June 1991, pages 137–143.

(4) D. S. Gardner et al, "Encapsulated Copper Interconnection Devices Using Sidewall Barriers," VMIC Conference Proceedings, June 1991, pages 99–108.

(5) J. A. T. Norman et al, "New OMCVD Precursors For Selective Copper Metallization," VMIC Conference Proceeding, June 1991, pages 123–129.

(6) J. D. McBrayer et al, "Diffusion of Metals in Silicon Dioxide," J. Electrochem. Soc., Vol. 133, June 1986, pp 1242–1246.

2b. Description of the Related Art

Much like the copper wires that conventionally interconnect discrete components in breadboard circuits, metal connectors are used in integrated circuits (IC's) to provide interconnections between distant points of integrated semiconductor circuits.

Aluminum has been the metal of choice for silicon based IC's. A continuous layer of aluminum is first sputter deposited onto a silicon-based substrate and portions of the aluminum layer are thereafter photo-lithographically patterned and removed to define conductors of specific shapes and sizes.

The two step process of depositing a metal layer onto a substrate and etching away parts of the deposited layer is referred to here as the coat & remove process.

The coat & remove process suffers from a number of disadvantages. It wastes materials because excess metal is sputtered on and then removed. It wastes energy because the energy used to coat on the metal layer and later remove the same metal is energy that is nonproductive. The coat & remove process also suffers from low manufacturing yields due to complications in the patterning half of the process.

Modern designs call for conductors of very fine width and fine pitch (e.g. submicron line widths and submicron line spacings). Forming metal conductors of fine width and spacing without unwanted shorts or opens is difficult, particularly when the coat & remove process is utilized. If etching is carried out for too much time during the metal removal step, unwanted open circuits may develop. If etching is carried out for too short a time during the metal removal step, unwanted metal may be left behind to create undesired short circuits. There is a long felt need in the industry to find a better way than the metal coat & remove process for defining fine-width and fine-pitch metal connections.

In addition to the above mentioned specific problems of the coat & remove process, there are a number of other problems of particular concern to metallization in general: (1) good adhesion of the metal conductors to insulative materials, (2) avoidance of contamination from the metal material of deposited metal conductors to adjoining structures, and (3) ease of patternability.

These general concerns become paramount when the metal conductors include copper. Copper is notorious for: (1) its poor adhesion qualities to silicon dioxide, (2) its tendency to readily diffuse through dielectric materials such as silicon dioxide under certain process conditions and contaminate an underlying silicon region, and (3) its resistance to traditional dry-etch patterning methods (RIE or plasma etch). Aluminum does not have these drawbacks.

Despite these problems, there is a long felt desire within the industry to find ways of including copper within the metal interconnect structure of an IC instead of or in addition to aluminum. Copper has a lower resistivity than aluminum and a higher electromigration immunity. The signal propagation delay of copper conductors is smaller, and as such, copper conductors are preferred in high speed circuits.

There are three conventionally-proposed methods for placing copper conductors on silicon-based substrates. Neither method has met with much commercial success and both methods are still considered to be more in the nature of laboratory-experiments rather than mature mass-production techniques.

In the first conventional method, a continuous interfacial film made of one or more layers having refractory metals such as titanium or tungsten is sputter deposited onto a substrate surface in cases where the substrate surface is composed of silicon and/or silicon dioxide. The interfacial film typically includes a Ti adhesion layer for providing good adhesion to $SiO_2$ and a TiW, TiN or $Ti_3N_4$ barrier layer on top for blocking diffusion. After this, a continuous copper layer is sputter deposited onto the TiN/Ti interfacial film. The upper copper film is then patterned by means of a patterning step specific to copper. The lower TiN/Ti interfacial film is thereafter patterned using a patterning step specific to its respective barrier and adhesion layers (e.g., TiN and Ti).

In the second conventionally-proposed method, a continuous interfacial film composed of Ti/TiN for example is sputter deposited onto the substrate and patterned immediately thereafter. Copper is then selectively grown on the patterned material of the interfacial film. The copper material adheres to the patterned material of the interfacial film but not to any exposed silicon dioxide. The problem with this method, however, is that copper adheres to the sidewalls of the interfacial metal conductors thereby producing excessively wide lines. The resulting, uncontrolled profile of the copper-coated lines is generally not acceptable for mass production of high density integrated circuits (IC's).

In the third conventionally-proposed method, the interfacial film is simultaneously formed and patterned by depositing tungsten (W) selectively onto the $Si/SiO_2$ surface using a CVD method. A major problem with this approach is that spurious nucleations tend to form shorts between adjacent lines.

The above described, conventionally-tried approaches have a number of overlapping problems. First, it is time-consuming and expensive to form a multi-layer interfacial film (e.g., TiN/Ti). Second, it is difficult to pattern copper with conventional dry-etch approaches. Third, even when a barrier metal layer (e.g., $Ti_3N_4$) is employed, some copper manages to migrate into and through adjacent silicon dioxide material and to contaminate a neighboring layer of silicon.

5,654,245

SUMMARY OF THE INVENTION

The present invention obviates the need for separate patterning of an interfacial film (e.g., TiN/Ti) prior to adhesion of an upper metal layer (e.g., Cu).

A metallization process in accordance with the invention comprises the steps of: (a) forming a patterned mask over an insulative layer; (b) implanting a nucleating species through the mask into the exposed surface of the insulating material; (c) removing the mask; and (d) selectively growing a metallization pattern on portions of the insulating layer that have been altered to include the nucleating species on their surface.

In a preferred embodiment, the metallization pattern is or includes copper, the nucleating species includes molybdenum, tungsten, tantalum and/or titanium (in the recited order of preference) and the insulating layer includes a top surface composed of silicon nitride ($Si_3N_4$) or a like material which acts as barrier to copper migration.

BRIEF DESCRIPTION OF THE DRAWINGS

The below detailed description makes reference to the accompanying drawings, in which.

DETAILED DESCRIPTION

Figure 1:
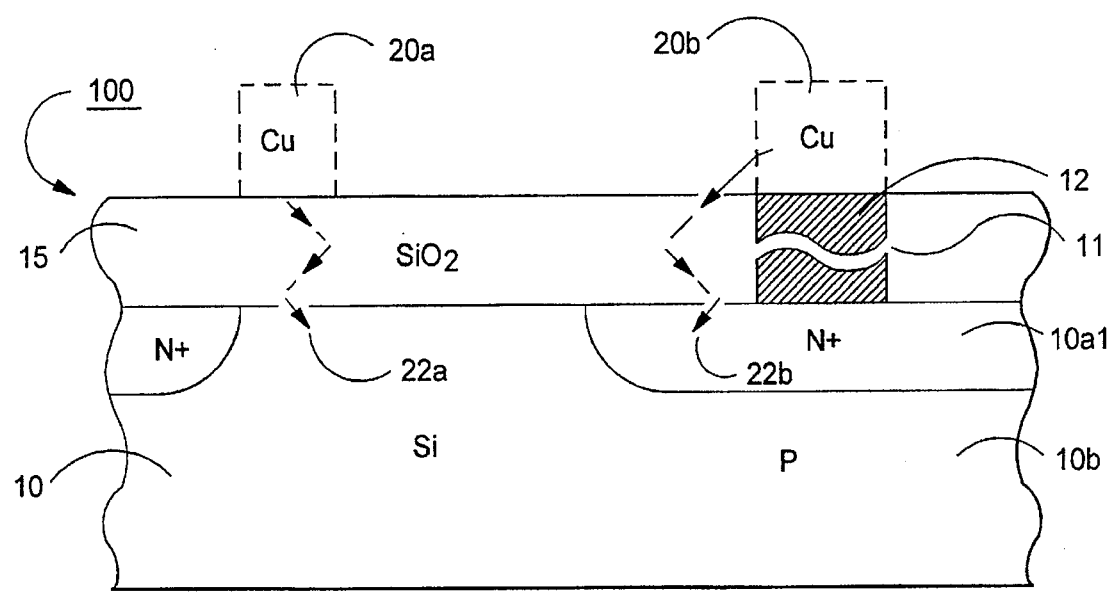
FIG. 1 shows a cross-section of an in-process integrated circuit structure prior to formation of hypothetically shown copper conductors.

FIG. 1 shows a cross-section of an in-process integrated circuit structure 100 comprised of a monocrystalline silicon substrate 10, a copper-permeable but Cu-adhesion-phobic first insulating layer 15 (e.g., $SiO_2$) disposed on the silicon substrate, and a metal conductor or via 12 (e.g., Ti or Al) protruding to the top of the first insulating layer 15. Metal conductor 12 connects to a first N+ doped portion 10a1 of silicon substrate 10. A second N+ doped portion 10a2 of silicon substrate 10 is shown for reasons that will become apparent later. A bulk portion 10b of silicon substrate 10 is doped to have a P type conductivity. First insulating layer 15 can be thermally grown on silicon substrate 10 or deposited by appropriate means.

A hypothetical first copper conductor 20a and a hypothetical second copper conductor 20b are shown in cross section as dashed blocks 20a and 20b. The hypothetical copper conductors, 20a and 20b, are shown respectively positioned on first insulating layer 15 and metal conductor 12 of FIG. 1 for the purpose of explaining why such a positioning is undesirable.

Although the specific conditions of and rates of copper diffusion through silicon dioxide are not fully understood, it is accepted that under certain process conditions, copper atoms can migrate along a path such as 22a from the hypothetical first copper conductor 20a through the copper-preamble first insulating layer ($SiO_2$) 15 to contaminate the underlying silicon substrate 10. A similar contamination path 22b is shown for the hypothetical copper block 20b positioned on metal conductor 12. Break 11 in the cross section of metal conductor 12 is drawn to indicate that metal conductor 12 can optionally be or include a metal (e.g., Ti/W) which is impermeable by copper atoms. Migration path 22b can nonetheless traverse the impermeable region 11 in a circumventing manner through the material ($SiO_2$) of the adjacent first insulating layer 15 to contaminate the underlying silicon substrate 10.

It is an object, of the invention to avoid such contamination. It is a further object of the invention to provide good adhesion between a copper or other low-resistivity metal and an underlying insulating layer. In FIG. 1, the adhesion between the hypothetical first copper conductor 20a and the first insulating layer 15 would have been relatively poor if it had been actually made because layer 15 is made of a material ($SiO_2$) which does not chemically adhere well to copper (it is copper-phobic). The adjective "metal-phobic" is used throughout this disclosure to refer to a disinclination of a given material (the metal-phobic material) to forming good adhesion with one or more specified metals or to providing a nucleation site for growth of such metals.

Figure 2:
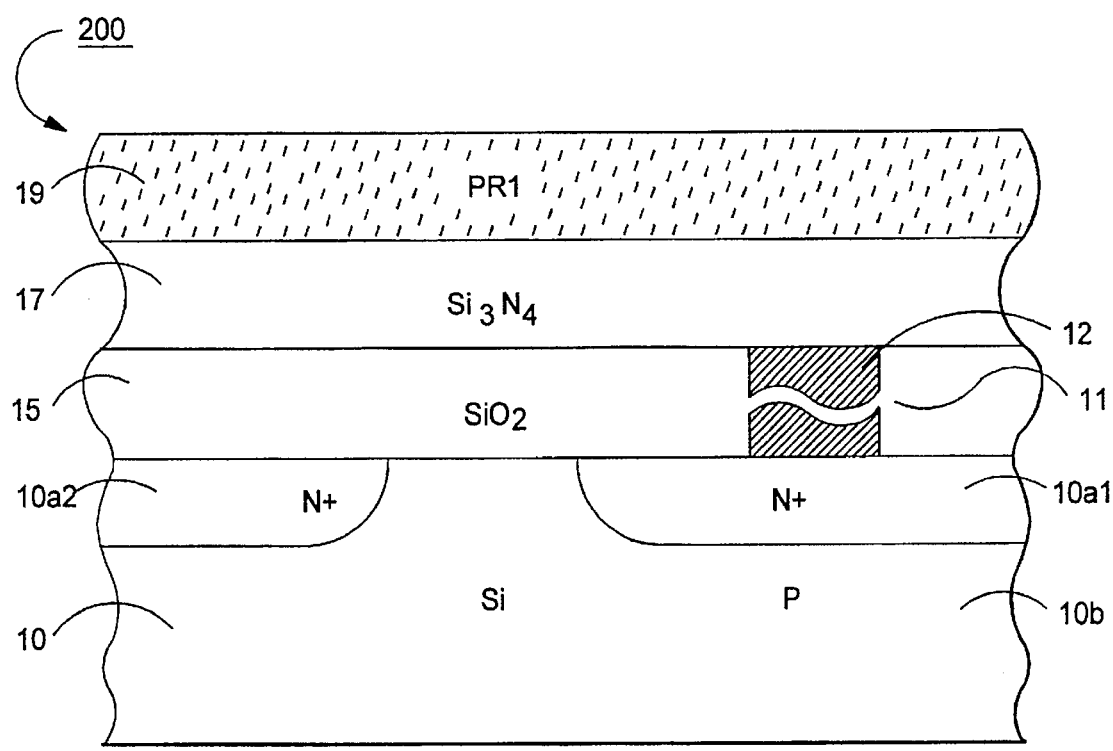
FIG. 2 shows a first step according to the invention in which a barrier layer (e.g., silicon nitride) that is impermeable to copper or another metal is deposited on the structure of FIG. 1 and a first photoresist layer is thereafter deposited onto the barrier layer.

FIG. 2 shows a cross section of a second in-process integrated circuit structure 200 formed according to a first step of the invention. A barrier layer 17 (e.g., a silicon nitride or a silicon oxi-nitride) that is impermeable to copper or another later-to-be introduced metal is deposited by CVD (chemical vapor deposition) or other appropriate means on the structure 100 of FIG. 1. A first photoresist layer (PR1) 19 is thereafter deposited onto the barrier layer 17.

The thickness of barrier layer 17 is preferably held equal to 20% or less of the thickness of first insulating layer 15 (e.g., $SiO_2$). There are several reasons for this. Silicon nitride insulators such as $Si_3N_4$ have a relatively high dielectric constant as compared to that of $SiO_2$. (The dielectric constant of $SiO_2$ is approximately 3.8 while the dielectric constant of $Si_3N_4$ is approximately 8.) An undesirable amount of capacitive coupling may develop between interconnect lines (e.g., between conductor 65 of upcoming FIG. 6 and substrate conductor 10a2) if the barrier layer 17 is made relatively thick and first insulating layer 15 is made relatively thinner. Also it would be more difficult to form vertical vias of small diameter or width (such as the via 52b shown in FIG. 5) through barrier layer 17 if layer 17 is made excessively thick. Moreover, if layer 17 is made too thick, it becomes difficult to remove a fill material 42 later formed in FIG. 4.

Figure 3:
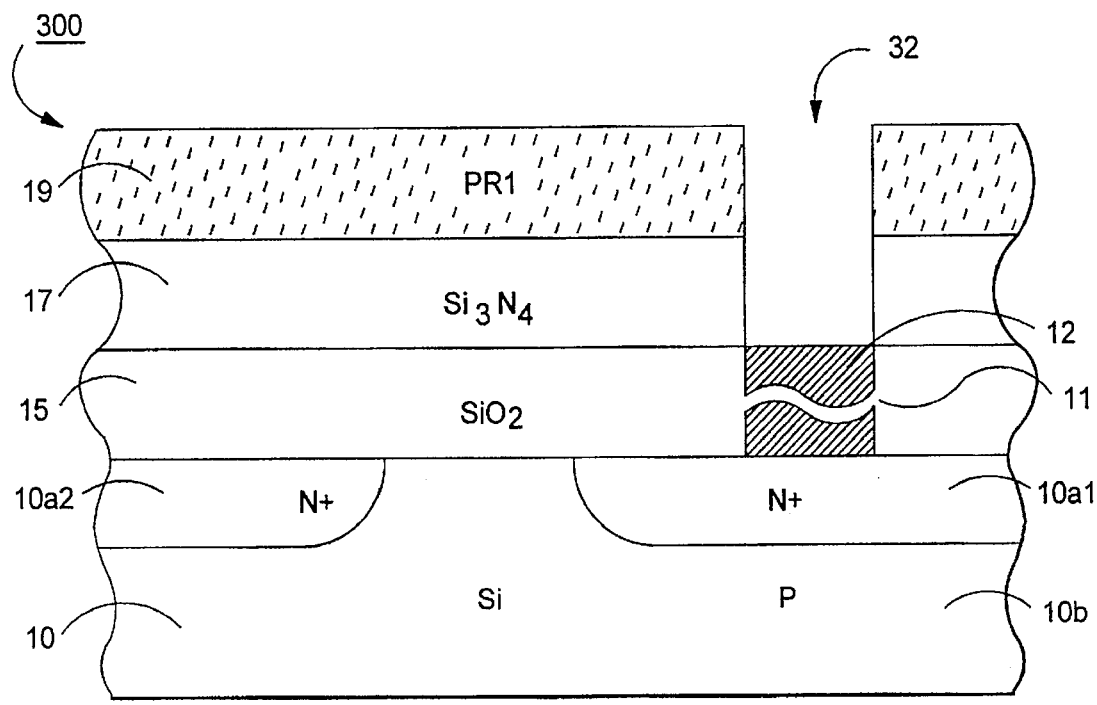
FIG. 3 shows a cross-section after a next step in which the first photoresist layer and the barrier layer and are patterned.

FIG. 3 shows a cross section of a third in-process integrated circuit structure 300 formed according to a second step of the invention. The first photoresist layer (PR1) 19 of structure 200 (FIG. 2) is patterned by appropriate photolithographic means to define an aperture 32 extending through layer 19 over metal conductor 12. Barrier layer 17 is thereafter selectively etched to extend aperture 32 through the barrier layer 17 to expose the top surface of metal conductor 12.

Figure 4:
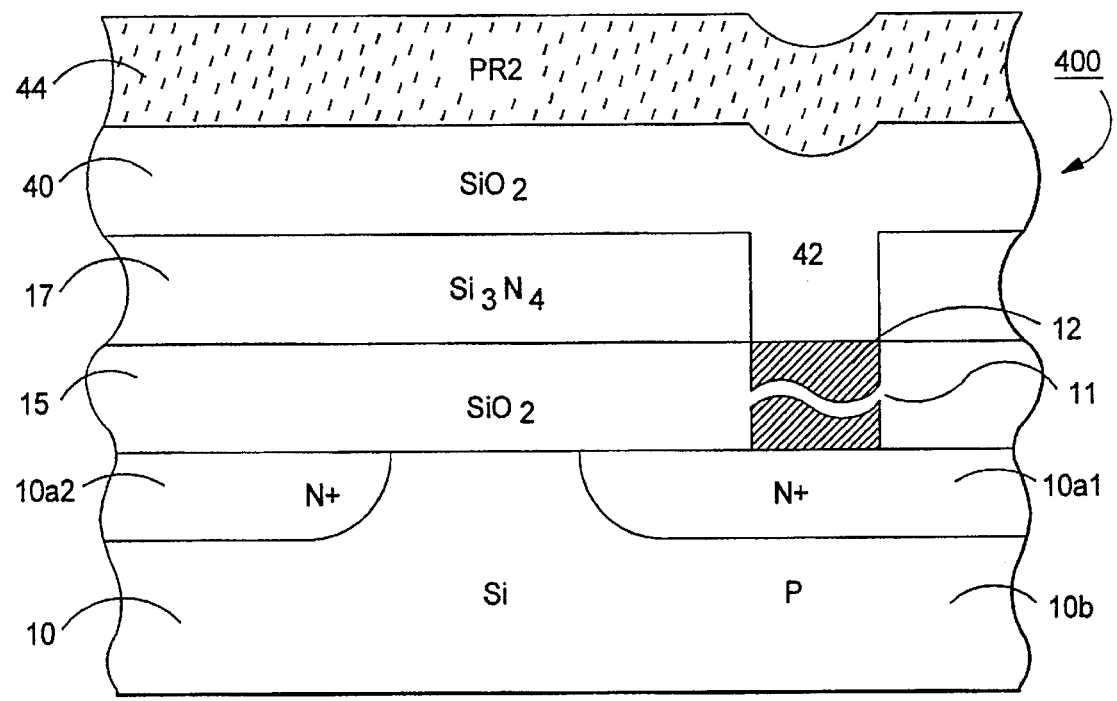
FIG. 4 shows a cross-section after a next step in which the first photoresist layer is stripped off, a metal-phobic layer (e.g. $SiO_2$) is deposited on the patterned barrier layer, and a second photoresist layer is deposited on the metal-phobic layer.

FIG. 4 Shows a cross section of a fourth in-process integrated circuit structure 400 formed according to a third step of the invention. The first photoresist layer (PR1) 19 of FIG. 3 is stripped away. A second metal-phobic/permeable layer (e.g. $SiO_2$ or SOG) 40 is deposited by CVD or other appropriate means on the patterned barrier layer 17. Part of the material 42 of the second metal-phobic/permeable layer 40 fills aperture 32. The metal-phobic properties of layer 40 are later used in one embodiment of the invention to define the growth profile of a selectively grown conductor (65 and 66 of FIG. 6). Layer 40 preferably also has good insulative properties (e.g., high breakdown voltage and low dielectric constant).

A second photoresist layer (PR2) 44 is thereafter deposited by CVD or other appropriate means on the metal-phobic layer 40.

Figure 5:
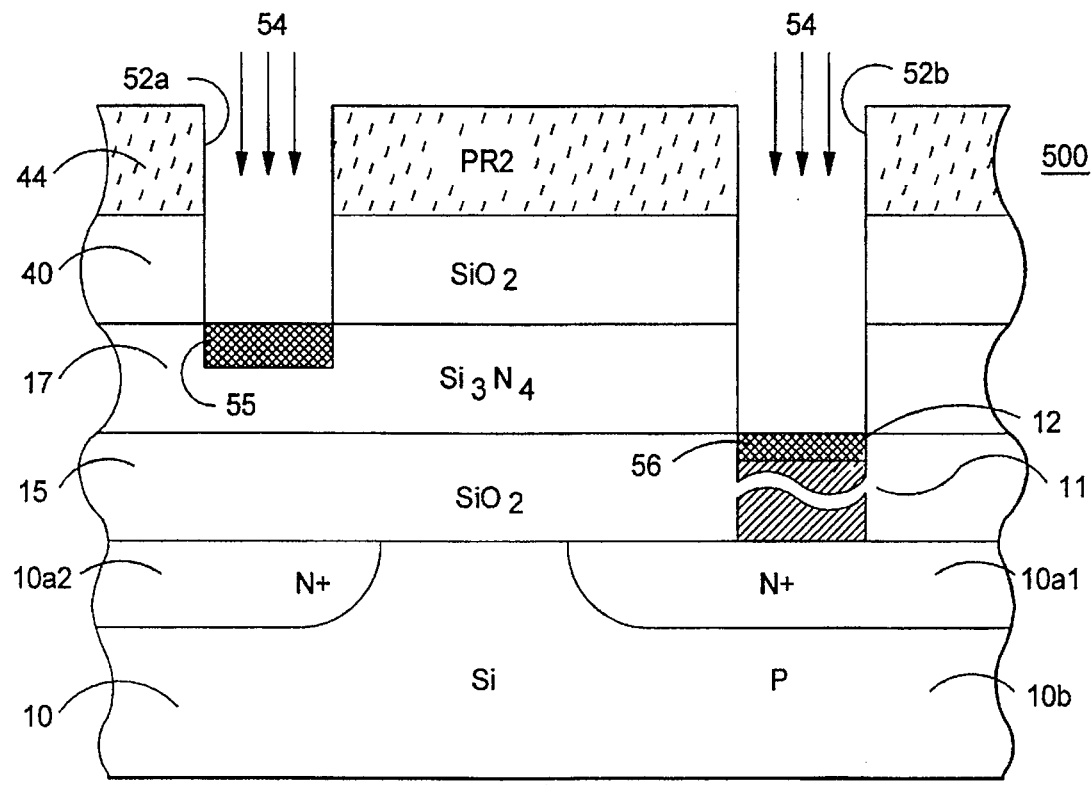
FIG. 5 shows a next cross-section in which the second photoresist layer and the metal-phobic layer are patterned to create windows for implanting a nucleating species into desired surface portions of the barrier layer and/or other portions of the substrate.

FIG. 5 shows a cross section of a fifth in-process integrated circuit structure 500 formed according to a fourth step of the invention. The second photoresist layer (PR2) 44 of FIGS. 4 is patterned by appropriate photolithographic means to define apertures 52a and 52b extending through layer 44 as shown. Aperture 52b is positioned over metal conductor 12. The material of second metal-phobic/permeable layer ($SiO_2$) 40 is selectively etched away to extend aperture 52a to an exposed top surface portion 55 of barrier layer 17 and to extend aperture 52a to an exposed top surface portion 56 of metal conductor 12.

Apertures 52a and 52b are then used as implant windows for implanting a nucleating species 54, preferably composed of a metal, more preferably composed of a refractory metal and even more preferably selected from the group consisting of molybdenum, tungsten, tantalum and titanium; into the respective top surface portions, 55 and 56, of barrier layer 17 and metal conductor 12. The implant energy and material of nucleating species 54 is selected as described further below. An ion accelerator can be used to ionize and implant the desired nucleating species 54.

Figure 6:
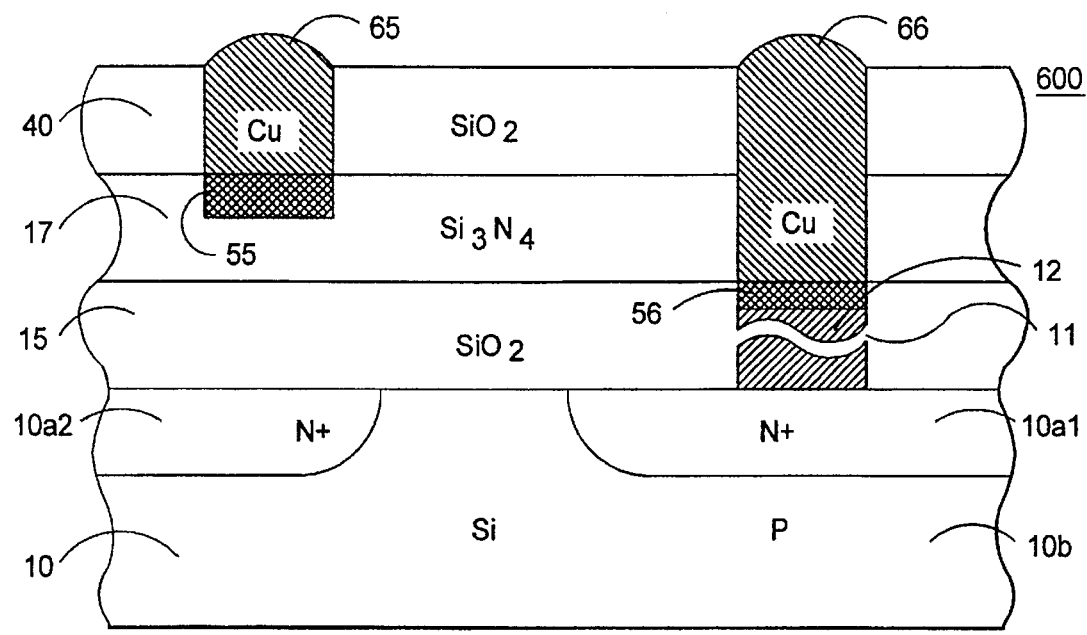
FIG. 6 shows a cross-section after a next step in which a metal (e.g., Cu) which is selectively adhesive to the nucleating species is grown on the surface portions that have the implanted nucleated species.

Referring to FIG. 6, the second photoresist layer (PR2) 44 of FIG. 5 is stripped away and the implanted top surface portions 55 and 56 are used as respective growth nucleating sites (or growth catalysis sites) for selectively growing copper, or other-metal, conductors 65 and 66. Copper can be selectively grown by means of metal-organic chemical vapor deposition (MOCVD) or plasma-enhanced metal-organic chemical vapor deposition (PECVD) or by electroplating. The metal-phobic material of the sidewalls formed by second metal-phobic layer ($SiO_2$) 40 limits the line width of the grown conductors 65 and 66. The metal-impermeable material of barrier layer 17 inhibits migration of atoms from the grown copper, or other-metal, conductors 65 and 66 through first insulating layer 15 to the underlying silicon substrate 10.

The first insulating layer ($SiO_2$) 15 preferably has a lower dielectric constant than the barrier layer ($Si_3N_4$) 17 so that undesired capacitive coupling between conductor 65 and conductive P or N portions of silicon substrate 10 is minimized. Barrier materials such as $Si_3N_4$ and oxinitrides tend to have relatively high dielectric constants. Insulating materials such as $SiO_2$ and SOG (Spin On Glass) tend to have lower dielectric constants. Low dielectric constant layer 15 is therefore preferably interposed between the substrate 10 and high dielectric layer 17 in cases where capacitive coupling from conductor 65 to conductive region 10a2 of substrate 10 is undesirable.

Of importance, note that the pattern of apertures 52a and 52b formed in FIG. 5, becomes the pattern for the copper or other metal conductors 65 and 66 formed in FIG. 6. The two-step, metal coat & remove process is obviated. The pattern imprinted into second photoresist layer (PR2) 44 of FIG. 5 becomes the pattern of conductors 65 and 66. Manufacturing cost is reduced and yield is improved by eliminating the problems inherent to the coat & remove process.

The copper, or other-metal, conductors 65 and 66 can be grown by CVD or more preferably MOCVD (metal organic chemical vapor deposition) techniques or other suitable means. The material and concentration of nucleating species 54 are preferably selected to provide a sufficient number of free electrons for exchange with the CVD or MOCVD copper (or other metal) precursor of the CVD or MOCVD process. A copper metal-organic precursor such as Cupra Select™ (a $Cu^{+1}$[hexafluoroacetylacetonate) trimethylvinylsilane) which is available from Shumacher Inc. of Carlsbad, Calif. and is described in the above cited paper of J. A. T. Norman et al may be used to grow copper on the implanted top surface portions 55 and 56.

Cupra Select™ belongs to a general family of copper metal-organic precursors known as Copper(II) (β-diketonate). Other members of the Copper(II) (β-diketonate) family may be used. The so-called "hfac" members are preferred. Three preferred members of the "hfac" subfamily are:

(1) (hfac)Cu(COD) [also known as (hexafluoro acetylacetonate) copper(I) (1,5 cyclooctadiene)];

(2) (hfac)Cu(VTMS) [also known as (hexafluoro acetylacetonate) copper(I) (vinyltrimethysilane)]; and (3) (hfac)Cu(BTMSA) [also known as (hexafluoro acetylacetonate) copper(I) (bis(trimethylsilyl) acetylene)].

The following list shows other possible copper precursors which may, under appropriate growth conditions, be used for selective growth of copper:

(1) Copper halides such as: (1a) $CuCl_2$; (1b) $CuF_2$; (1c) $Cu(hfac)_2$ [also known as copper(II) bis(hexafluoro acetylacetonate)]; (1d) $Cu(ppm)_2$ [also known as copper(II) bis (pentafluoropropanoylpivaloylmethanato)]; (1e) $Cu(dpm)_2$ [also known as copper(II) bis (dipivaloylmethanato)]; (1f) $Cu(nona-F)_2$ [also known as copper(II) bis(trifluoroethyl amino hexafluoro pentanol)]; (1g) $(CuO-t-Bu)_4$ [also known as copper(I) (tert-butoxide)]; (1h) (t-BuO)CuPMe$_3$ [also known as (tert-butoxy) copper(I) (trimethylphosphine)]; (1i) ($\eta^5$-$C_5H_5$)CuPMe$_3$ [also known as (cyclopentadienyl) copper(I) (trimethylphosphine)]; (1j) ($\eta^5$-$C_5H_5$)CuPEt$_3$ [also known as (cyclopentadienyl) copper(I) (triethylphosphine)]; (1k) (acac)CuPMe$_3$ [also known as (acetylacetonate) copper(I) (trimethylphosphine)]; (1l) (tfac)CuPMe$_3$ [also known as (trifluoro acetylacetonate) copper(I) (trimethylphosphine)]; (1m) (hfac)CuPMe$_3$ [also known as (hexafluoro acetylacetonate) copper(I) (trimethylphosphine)]; (1n) (hfac)Cu(2-butyne) [also know as (hexafluoro acetylacetonate) copper(I) (2-butyne)]; and (1o) (hfac) Cu(2-pentyne) [also known as (hexafluoro acetylacetonate) copper(I) (2-pentyne)];

(2) Copper(II) (Schiff base);

(3) Copper(I) alkoxide;

(4) (Cyclopentadienyl) Copper(I) phosphine;

(5) (β-diketonate) Copper(I) phosphine; and (6) (hfac) Copper(I) Olefins and Alkynes A more detailed discussion of these precursors may be found in "RECENT ADVANCES IN COPPER CVD" A. Jain et al, Chemical Engineering Department, University of New Mexico, Albuquerque, N. Mex.

As mentioned above, the candidates for the nucleating species 54 are preferably metals and more preferably, refractory metals selected from the group consisting of molybdenum, tungsten, tantalum and titanium. The particular candidate chosen for the nucleating species 54 depends on the desired depth of implant and the amount of damage that is tolerable in the underlying first insulating layer 15 and/or silicon substrate 10 due to overshoot of atoms during implantation and the chemistry of the CVD or MOCVD or other deposition process. More massive atoms such as tungsten have higher kinetic energy and tend to cause more damage to the underlying structures as a result of overshoot during implantation. Medium sized atoms such as molybdenum tend to cause less damage, and hence are preferred.

Figure 7:
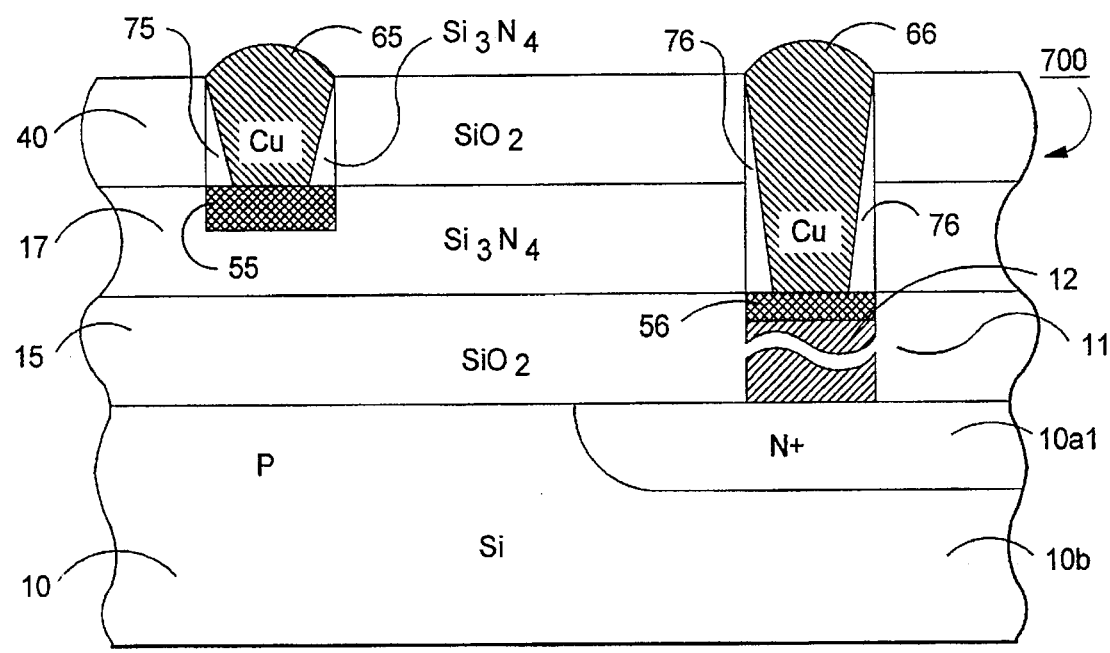
FIG. 7 shows a cross-section of an alternate embodiment in which, after the structure of FIG. 5, barrier side walls are formed prior to growth of the metal (e.g., Cu) conductors.

Referring to FIG. 7, in an alternate embodiment the structure 500 of FIG. 5 is modified after removal of second photoresist layer (PR2) 44 by forming barrier ($Si_3N_4$) sidewalls 75 and 76 in apertures 52a and 52a prior to growth of conductors 65 and 66. Barrier sidewalls 75 and 76 are composed of $Si_3N_4$ or another metal-impermeable material and they thus provide extra protection against the danger of metal diffusion from conductors 65 and 66 into first insulating layer 15 and/or silicon substrate 10. In addition to $Si_3N_4$, nitrogen-rich silicon oxy-nitrides of the general form $SiO_xN_y$ may be used as barriers against unwanted diffusion of copper or other metals.

In addition to, or as an alternative to, implantation of a nucleating species 54, a neutral species can be ion implanted into the top surface portions 55 and 56 of FIG. 5 for the purpose of providing surface roughening. The roughened surface provides a preferential point of nucleation for the later grown or deposited metal conductors 65 and 66.

The above disclosure is to be taken as illustrative of the invention, not as limiting its scope or spirit. Numerous modifications and variations will become apparent to those skilled in the art after studying the above disclosure.

Given the above disclosure of general concepts and specific embodiments, the scope of protection sought is to be defined by the claims appended hereto.

What is claimed is:

1. A metallization process comprising the steps of:
   (a) forming an implant mask over an insulation layer wherein the insulation layer includes a barrier material which acts as barrier to migration of copper, the implant mask having one or more mask apertures defined therethrough for exposing underlying surface portions of the insulation layer;
   (b) implanting a nucleating species through the mask apertures into the exposed surface portions of the insulation layer;
   (c) removing the mask; and
   (d) selectively growing a metallization pattern, composed mostly of copper, on surface portions of the insulation layer that have been altered to include the nucleating species;
      wherein said nucleating species includes a refractory metal selected from the group consisting of molybdenum, tungsten, tantalum and titanium.

2. A metallization process comprising the steps of:
   (a) forming an implant mask over an insulation layer, the implant mask having one or more mask apertures defined therethrough for exposing underlying surface portions of the insulation layer;
   (b) implanting a nucleating species through the mask apertures into the exposed surface portions of the insulation layer;
   (c) removing the mask; and
   (d) selectively growing a metallization pattern, which is composed of copper, using a precursor compound that is a copper metal-organic precursor on the surface portions of the insulation layer that have been altered to include the nucleating species;
      wherein said nucleating species includes a refractory metal selected from the group consisting of molybdenum, tungsten, tantalum and titanium.

3. A metallization process comprising the steps of:
   (a) forming a patterned mask over an insulation layer;
   (b) implanting a nucleating species through the mask into the exposed surface of the insulation layer;
   (c) removing the mask; and
   (d) selectively growing a metallization pattern on portions of the insulation layer that have been altered to include the nucleating species;
      wherein the metallization pattern is or includes copper;
      wherein the step of selectively growing includes using a copper metal-organic precursor, and
      wherein the copper metal-organic precursor includes Copper (II) (βeta-diketonate).

4. A metallization process comprising the steps of:
   (a) forming a patterned mask over an insulation layer;
   (b) implanting a nucleating species through the mask into the exposed surface of the insulation material;
   (c) removing the mask; and
   (d) selectively growing a metallization pattern on portions of the insulating layer that have been altered to include the nucleating species on their surface;
      wherein the metallization pattern is or includes copper;
      wherein the step of selectively growing includes using a copper metal-organic precursor, and
      wherein all or a component of the copper metal-organic precursor is selected from the group consisting of:
         (1) (hfac)Cu(COD), (hexafluoroacetylacetonate) copper(I) (1,5 cyclooctadiene);
         (2) (hfac)Cu(VTMS), (hexafluoroacetylacetonate) copper(I) (vinyltrimethylsilane); and
         (3) (hfac)Cu(BTMSA), (hexafluoroacetylacetonate) copper(I) (bis(trimethylsilyl)acetylene.

5. A metallization process according to claim 1 wherein said barrier material includes silicon nitride.

6. A metallization process comprising the steps of:
   (a) selectively implanting a nucleating species into surface portions of an insulation layer, wherein said nucleating species includes a refractory metal; and
   (b) selectively growing by way of chemical vapor deposition (CVD) a metallization pattern, composed mostly of copper, on the portions of the insulation layer that have been altered to include the nucleating species.

7. A metallization process according to claim 6 wherein the nucleating species refractory metal includes at least one of molybdenum, tungsten, tantalum and titanium.

8. A metallization process according to claim 6 wherein the insulation layer includes a material which acts as a barrier to migration of copper from the metallization pattern.

9. A metallization process according to claim 8 wherein said implanting step implants the nucleating species into the barrier material.

10. A metallization process according to claim 6 wherein the insulation layer has one or more apertures defined therethrough, the apertures having copper-permeable sidewalls, and said step (b) of selectively growing a metallization pattern is preceded by the additional step of:

(c) coating the copper-permeable sidewalls of said one or more apertures with the barrier material that acts as barrier to copper migration;

and further wherein said step (b) of selectively growing a metallization pattern includes growing said metallization pattern within the barrier-coated one or more apertures.

11. A metallization process comprising the steps of:

(a) selectively implanting a nucleating species into surface portions of an insulation layer, wherein said nucleating species includes a refractory metal; and (b) selectively growing using a compound that functions as a copper metal-organic precursor by chemical vapor deposition (CVD) a metallization pattern, comprising copper, on the portions of the insulation layer that have been altered to include the nucleating species.

12. A metallization process comprising the steps of:

(a) providing a substrate having metal-phobic sections, the metal-phobic sections being such that they have a disinclination to adhering with a metal composed of copper;

(b) forming a copper migration-barrier layer over at least a portion of at least one of the metal-phobic sections in the substrate;

(c) selectively implanting a nucleating species into the copper migration-barrier layer and surface portions of the substrate, wherein said nucleating species includes a refractory metal and wherein the surface portions are immediately adjacent to said metal-phobic sections; and (d) selectively growing by way of chemical vapor deposition (CVD) the metal on the surface portions and the copper migration-barrier layer that have been altered to include the nucleating species and wherein the selectively growing by way of CVD includes using a compound that functions as a copper metal-organic precursor.

13. A metallization process comprising the steps of:

(a) providing a substrate having metal-phobic sections, the metal-phobic sections being characterized as having a disinclination to adhering with a specific metal;

(b) forming a migration-barrier layer, having opposed first and a second sides, through which the specific metal cannot migrate over at least a portion of at least one of the metal-phobic sections in the substrate;

(c) selectively implanting a nucleating species into the migration-barrier layer and surface portions of the substrate, wherein said nucleating species includes a refractory metal and wherein the surface portions are immediately adjacent to said metal-phobic sections; and (d) selectively growing by way of chemical vapor deposition (CVD) the specific metal on the surface portions and the migration-barrier layer that have been altered to include the nucleating species where the selectively growing of the specific metal is limited to not extending beyond one of the opposed first and second sides of the migration-barrier layer.

14. A metallization process according to claim 13 wherein the specific metal is composed mostly of copper and the migration-barrier layer is substantially impermeable to copper.

15. A metallization process according to claim 13 further comprising the step of:

(e) before forming the metal-migration barrier layer, forming in the substrate beyond the position of said one side of the migration-barrier layer to be formed, a semiconductor region that can be contaminated by the specified metal.

16. A metallization process according to claim 15 wherein:

the semiconductor region is composed of silicon;

the specific metal is composed mostly of copper; and the migration-barrier layer includes silicon nitride.

17. A metallization process according to claim 13 wherein:

said metal-phobic sections are composed of $SiO_2$ and/or $Si_3N_4$.

18. A metallization process comprising the steps of:

(a) selectively implanting a nucleating species into surface portions of an insulation layer; and (b) selectively growing a metallization pattern on the portions of the insulation layer that have been altered to include the nucleating species on their surface wherein the metallization pattern includes copper and wherein the step of selectively growing includes using a compound that functions as a copper metal-organic precursor.

19. A metallization process comprising the steps of:

(a) providing a substrate having metal-phobic sections, the metal-phobic sections being characterized as having a disinclination to adhering with a specific metal;

(b) selectively implanting a nucleating species into surface portions of the substrate, the surface portions being in or immediately adjacent to said metal-phobic sections; and (c) selectively growing the specific metal on the surface portions that have been altered to include the nucleating species;

wherein the specific metal is composed mostly of copper; and wherein the step (c) of selectively growing includes using a compound that functions as a copper metal-organic precursor.

20. A metallization process comprising the steps of:

(a) selectively implanting a nucleating species into surface portions of an insulation layer; and (b) selectively growing by way of metal-organic chemical vapor deposition (MOCVD) a metallization pattern on the surface portions of the insulation layer that have been altered to include the nucleating species.

21. A metallization process comprising the steps of:

(a) selectively implanting a nucleating species into surface portions of an insulation material; and (b) selectively growing by way of plasma-enhanced metal-organic chemical vapor deposition (PECVD) a metallization pattern on the surface portions of the insulation layer that have been altered to include the nucleating species.

22. A metallization process according to claim 1 wherein said nucleating species is limited essentially to a refractory metal selected from the group consisting of molybdenum and tungsten.

23. A metallization process according to claim 1 wherein the nucleating species is limited essentially to molybdenum.

24. A metallization process according to claim 6 wherein the nucleating species is limited essentially to a refractory metal selected from the group consisting of molybdenum and tungsten.

25. A metallization process according to claim 6 wherein said nucleating species is limited essentially to molybdenum.

26. A metallization process according to claim 12 wherein the refractory metal of said nucleating species is a metal selected from the group consisting of molybdenum and tungsten.

27. A metallization process according to claim 12 wherein the refractory metal of said nucleating species is limited essentially to molybdenum.

28. A metallization process for depositing a metal, comprised of copper, over a first isolation layer immediately adjacent to a substrate where the first isolation layer includes metal within via holes to make contact to the substrate, the metallization process comprising the steps of:

(a) forming a barrier layer over the first isolation layer where the barrier layer is composed of a barrier material which acts as barrier to migration of copper;

(b) forming via holes in the barrier layer to provide access to the metal in the via holes in the first isolation layer;

(c) depositing a second isolation layer upon the barrier layer where the via holes in the barrier layer is filled by the isolation layer;

(d) forming via holes through the second isolation layer and the barrier layer to provide access to the metal in the via holes in the first isolation layer;

(e) forming a metallization pattern extending through the second isolation layer to the barrier layer;

(f) selectively implanting a nucleating species of a refractory metal into the metal in the via holes in the first isolation layer and the barrier layer and the exposed portion of the barrier layer of the metallization pattern in the second isolation layer;

(g) depositing upon the implanted nucleating species a copper metal-organic precursor; and (h) depositing the metal comprising copper to fill the via holes in the second isolation layer and the barrier layer and the metallization pattern in the second isolation layer.

29. A metallization process for depositing a metal, comprised of copper over a first isolation layer immediately adjacent to a substrate where the first isolation layer includes metal within via holes to make contact to the substrate, the metallization process comprising the steps of:

(a) forming a barrier layer over the first isolation layer where the barrier layer is composed of a barrier material which acts as barrier to migration of copper;

(b) forming via holes in the barrier layer to provide access to the metal in the via holes in the first isolation layer;

(c) depositing a second isolation layer upon the barrier layer where the via holes in the barrier layer is filled by the isolation layer;

(d) forming via holes through the second isolation layer and the barrier layer to provide access to the metal in the via holes in the first isolation layer;

(e) forming a metallization pattern extending through the second isolation layer to the barrier layer;

(f) selectively implanting a nucleating species of a refractory metal into the metal in the via holes in the first isolation layer and the exposed portion of the barrier layer of the metallization pattern in the second isolation layer;

(g) selectively forming a barrier layer onto all side walls of the via holes through the second isolation layer and the barrier layer and the metallization pattern in the second isolation layer;

(h) depositing upon the implanted nucleating species a copper metal-organic precursor; and (i) depositing the metal comprised of copper to fill the via holes extending through the second isolation layer and the barrier layer and the metallization pattern in the second isolation layer.

* * * * *